US010895601B2

(12) United States Patent
Bogus et al.

(10) Patent No.: US 10,895,601 B2
(45) Date of Patent: Jan. 19, 2021

(54) SYSTEM AND METHOD OF MONITORING A SWITCHING TRANSISTOR

(71) Applicant: Infineon Technologies AG, Neubiberg (DE)

(72) Inventors: Matthias Bogus, Munich (DE); Jens Barrenscheen, Munich (DE); Christian Heiling, Graz (AT); Benno Koeppl, Markt Indersdorf (DE); Markus Zannoth, Neubiberg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/409,131

(22) Filed: May 10, 2019

(65) Prior Publication Data
US 2020/0355745 A1 Nov. 12, 2020

(51) Int. Cl.
| H02P 27/08 | (2006.01) |
| H02H 7/08 | (2006.01) |
| G01R 31/327 | (2006.01) |
| H03K 17/082 | (2006.01) |
| G01R 31/26 | (2020.01) |

(52) U.S. Cl.
CPC ..... *G01R 31/3277* (2013.01); *G01R 31/2617* (2013.01); *G01R 31/2621* (2013.01); *H02H 7/0833* (2013.01); *H02P 27/08* (2013.01); *H03K 17/0822* (2013.01); *H03K 17/0828* (2013.01)

(58) Field of Classification Search
None
See application file for complete search history.

(56) References Cited

U.S. PATENT DOCUMENTS

| 5,923,676 A | 7/1999 | Sunter et al. |
| 6,219,305 B1 | 4/2001 | Patrie et al. |
| 8,232,941 B2 | 7/2012 | Yeo et al. |
| 8,237,385 B2 | 8/2012 | Street |
| 9,323,595 B2* | 4/2016 | Yamada .............. G06F 11/0739 |
| 10,158,296 B1* | 12/2018 | Strijker ............ H02M 3/33523 |
| 10,411,691 B2* | 9/2019 | Hokazono ........... H03K 17/168 |
| 2005/0083066 A1* | 4/2005 | Tani ........................ G06F 1/28 324/509 |
| 2006/0018636 A1* | 1/2006 | Watanabe ............. F02D 11/107 388/804 |
| 2012/0249037 A1* | 10/2012 | Iwamiya ................. H02P 7/29 318/459 |
| 2017/0302214 A1* | 10/2017 | Marcinkiewicz ....... F04B 35/04 |
| 2018/0062511 A1* | 3/2018 | Wong .................... H02M 3/156 |

* cited by examiner

*Primary Examiner* — Bickey Dhakal
(74) *Attorney, Agent, or Firm* — Slater Matsil, LLP

(57) ABSTRACT

In accordance with an embodiment, a method includes using a monitoring circuit disposed on a monolithic integrated circuit to monitor an output signal of a first switching transistor for a first output edge transition at a monitoring terminal of the monolithic integrated circuit; using a time measuring circuit disposed on the monolithic integrated circuit to measure a first time delay between a first input edge transition of a first drive signal and the first output edge transition, where the first drive signal is configured to cause a change of state of the first switching transistor; using an analysis circuit disposed on the monolithic integrated circuit to compare the measured first time delay with a first predetermined threshold to form a first comparison result; and indicating a first error condition based on the first comparison result.

21 Claims, 9 Drawing Sheets

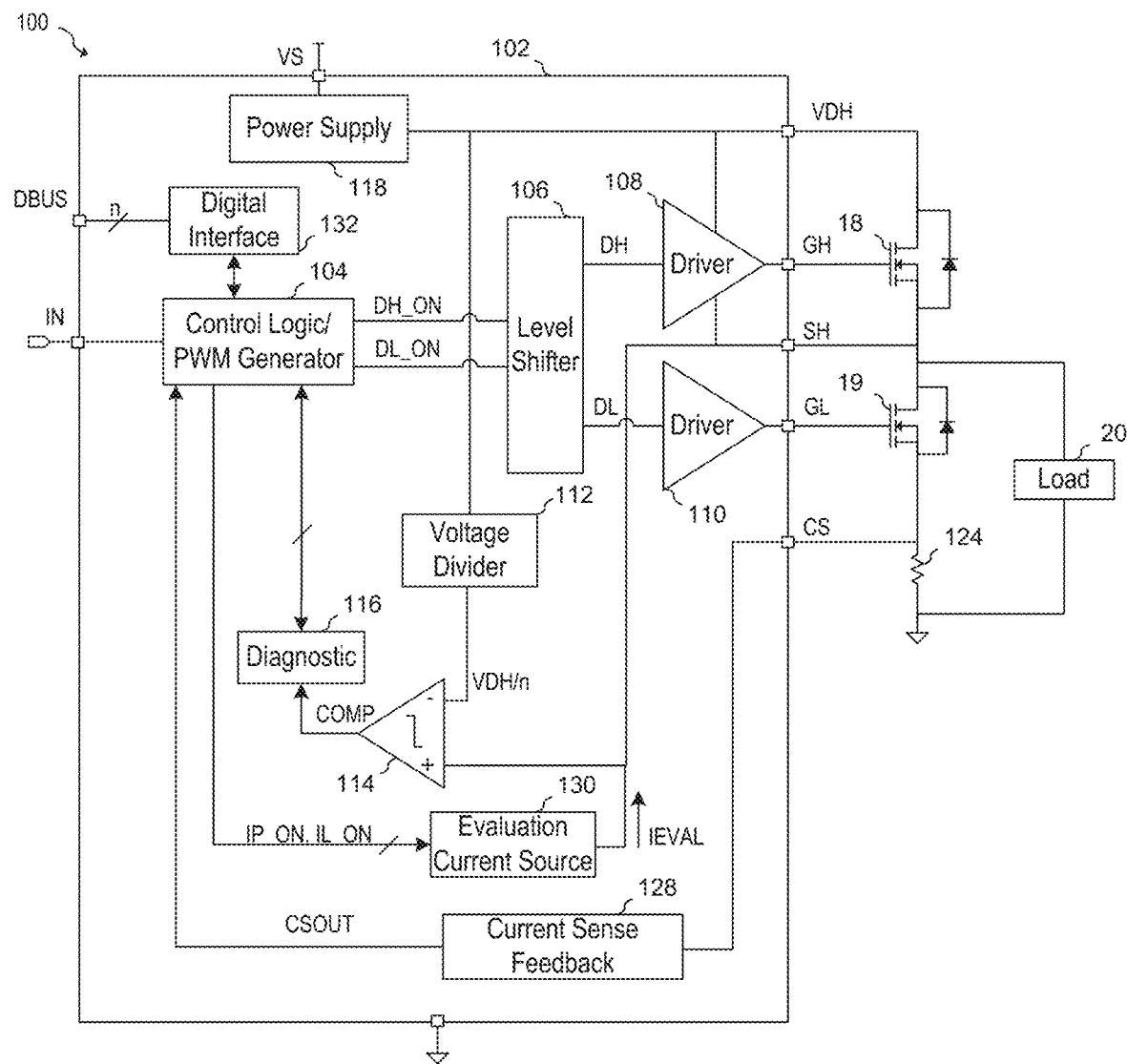
*Fig. 2A*
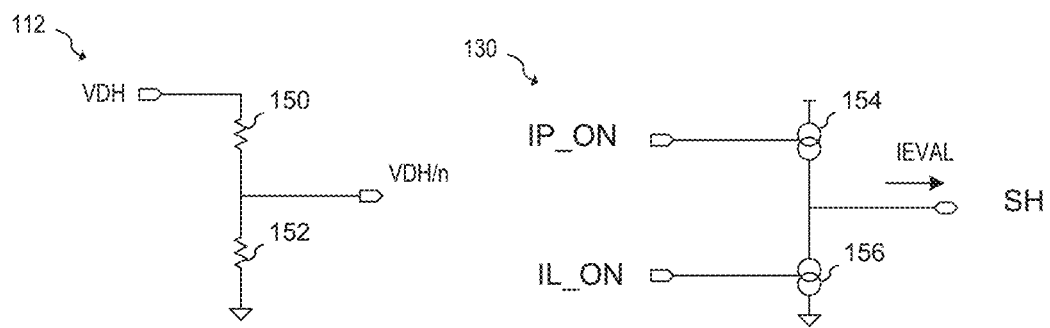
*Fig. 2B*  *Fig. 2C*

SYSTEM AND METHOD OF MONITORING A SWITCHING TRANSISTOR

TECHNICAL FIELD

The present invention relates generally to a system and method for monitoring a switching transistor.

BACKGROUND

AC motors such as three-phase motors are gaining popularity in applications such as automotive, industrial, and HVAC (heat, ventilating and air conditioning). By replacing the mechanical commutator used in traditional motors with electronic devices, improved reliability, improved durability and small form factors are achieved. Additional advantages of AC motors include better speed versus torque characteristics, faster dynamic response, and higher speed ranges, as examples. Generally, an AC motor (e.g., a three-phase motor) has a controller that generates a pulse-width modulated (PWM) signal used to produce drive signals for power switches coupled to different phases of the motor. These PWM signals may determine the average voltage and average current supplied to the coils of the motor, thus controlling the motor speed and torque. Generally, these PWM signals are supplied by circuits that include switching transistors. Depending on the power requirement of the motor, these switching transistors may carry high currents in order to drive the motor.

In safety critical motor applications, such as automotive applications, safety circuitry may be implemented to detect failures in the motor and the control circuitry coupled to the motor. This safety circuit may be configured to shut-down the motor and/or deactivate high current paths connected to the motor when a failure is detected. For example, high current paths may be deactivated upon detection of a short circuit in order to prevent high heat conditions or device destruction. However, since high currents are routinely supplied to the motor during the course of normal operation, differentiating a normal operating condition from a failure condition may be challenging.

SUMMARY

In accordance with an embodiment, a method includes using a monitoring circuit disposed on a monolithic integrated circuit to monitor an output signal of a first switching transistor for a first output edge transition at a monitoring terminal of the monolithic integrated circuit; using a time measuring circuit disposed on the monolithic integrated circuit to measure a first time delay between a first input edge transition of a first drive signal and the first output edge transition, where the first drive signal is configured to cause a change of state of the first switching transistor; using an analysis circuit disposed on the monolithic integrated circuit to compare the measured first time delay with a first predetermined threshold to form a first comparison result; and indicating a first error condition based on the first comparison result.

In accordance with another embodiment, an integrated circuit includes a monitoring circuit having an input coupled to a monitoring terminal configured to be coupled to an output terminal of a first switching transistor, where the monitoring circuit is configured to monitor an output signal at the monitoring terminal for a first output edge transition; a time measuring circuit coupled to the monitoring circuit, where the time measuring circuit is configured to measure a first time delay between a first input edge transition of a first drive signal and the first output edge transition, and where the first drive signal is configured to cause a change of state of the first switching transistor; and an analysis circuit coupled to the time measuring circuit and configured to compare the measured first time delay with a first predetermined threshold to form a first comparison result and to indicate a first error condition based on the first comparison result.

In accordance with a further embodiment, a motor system includes a first switching transistor; a second switching transistor; and at least one motor control circuit disposed on a monolithic integrated circuit. The at least one motor control circuit includes a first drive circuit having an output coupled to a control terminal of the first switching transistor, where the first drive circuit is configured to receive a first drive input signal having a first input edge transition and to generate a first drive signal based on the first drive input signal, and where the first drive signal is configured to cause a change of state of the first switching transistor; a second drive circuit having an output coupled to a control terminal of the second switching transistor, where the second drive circuit is configured to receive a second drive input signal having a second input edge transition and to generate a second drive signal based on the second drive input signal, and where the second drive signal is configured to cause a change of state of the second switching transistor; a comparator circuit having an input coupled to an output terminal of the first switching transistor and an output terminal of the second switching transistor, where the comparator circuit is configured to monitor an output signal at a monitoring terminal for a first output edge transition and a second output edge transition; a counter circuit coupled to the first drive circuit, the second drive circuit, and the comparator circuit, where the counter circuit is configured to measure a first time delay between the first input edge transition and the first output edge transition and to measure a second time delay between the second input edge transition and the second output edge transition; and an analysis circuit coupled to the counter circuit. The analysis circuit is configured to compare the measured first time delay with a first predetermined threshold to form a first comparison result, compare the measured second time delay with a second predetermined threshold to form a second comparison result, indicate a first error condition based on the first comparison result, and indicate a second error condition based on the second comparison result.

BRIEF DESCRIPTION OF THE DRAWINGS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIG. 2A illustrates a switching system according to a further embodiment; FIG. 2B illustrates an embodiment voltage divider circuit; FIG. 2C illustrates an embodiment evaluation current source circuit.

Figure 1A:
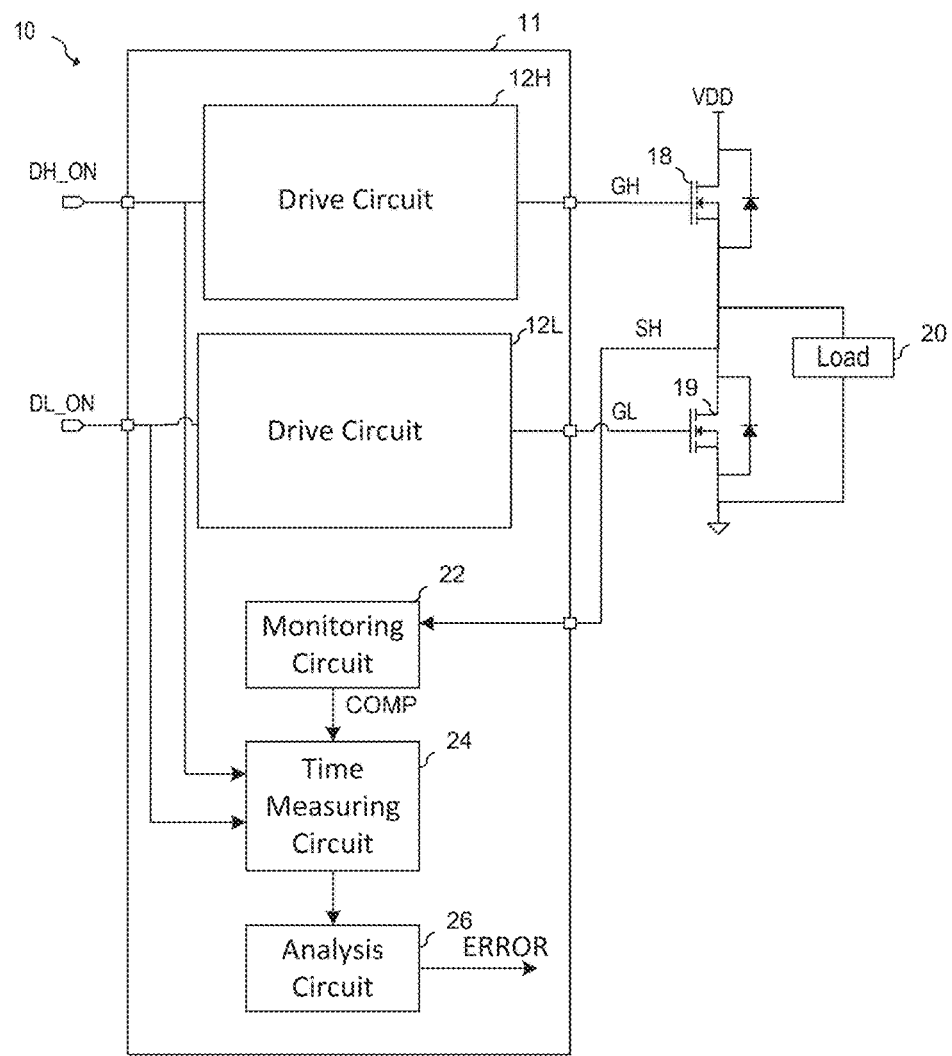
FIG. 1A illustrates an embodiment switching system.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for monitoring a switching transistor in the context of a motor control circuit. The invention, however, can be applied to other types of circuits that control the switching state of one or more transistors including, but not limited to switched-mode power supply systems, power systems, industrial control systems, audio systems and processing systems.

In accordance with an embodiment, the operational integrity of a switch driving system that includes a drive circuit coupled to a switching transistor is monitored by measuring a time delay between an assertion of a drive signal (e.g. an input or an output of the drive circuit) and a change of state at the output of the switching transistor. By monitoring this time delay, various faults can be quickly detected and corrective action taken. For example, if a short circuit at the output of the switching transistor is detected, the switching transistor can be immediately shut down before extensive thermal damage occurs. Monitoring this time delay can also detect other types of failures in the switch driving system. For example, monitoring the time delay can detect the drift of switching transistor device parameters that affect switching time, such total gate charge, gate-drain capacitance, gate resistance and other parameters that may vary with age, temperature and device damage. Accordingly, an advantage of some embodiment switch driving systems includes the ability to identify latent faults, such as a slight degradation in circuit performance, prior to a catastrophic malfunction of the switch driving system.

In some embodiments, the monitoring of timing delays may provide sufficient fault coverage to allow for the optional removal of other safety monitoring systems, such as the monitoring of drain and source voltages of switching transistors. Such monitoring systems often require extensive area and power intensive circuitry such as floating analog-to-digital converters. Therefore, the removal of such systems may lead to cost savings due the reduced area and power required to implement an embodiment switch driving system.

In some embodiments, other time delays within the switch driving system, such as dead-time delays and freewheeling time can be measured to provide additional system status. This additional timing information can be used by the switch driving system to detect dead-time violations, detect the possible presence of shoot-though current in the switching transistors, and verify the switching time of the switching transistors.

Advantageous aspects of embodiments further include the ability to quickly detect failures and perform system monitoring tasks without incurring extensive system delays in comparison with systems that perform performance monitoring via an external controller. In addition, a smaller, more compact switching system taking up less printed circuit board (PCB) space can be implemented using embodiments in which monitoring functions are integrated on the same integrated circuit with the driver circuit. Integration on the same monolithic semiconductor substrate is also advantageous in the sense that the resulting reduction of board-level traces reduces the effect of environmental and power-supply related noise injection.

FIG. 1A illustrates a switching system 10 according to an embodiment of the present invention. As shown, switching system 10 includes integrated circuit 11 coupled to a half-bridge driver that includes high-side switching transistor 18 (also referred to as a "first switching transistor") and low-side switching transistor 19 (also referred to as a "second switching transistor"). Drive circuit 12H (also referred to as a "high-side driver" or "first drive circuit") includes a drive input DH_ON and a drive output GH (also referred to as a "drive terminal") that is coupled to the gate (also referred to as a "control terminal") of high-side switching transistor 18. During operation, drive circuit 12H produces a first drive output signal (also referred to as "drive signal GH") on drive output GH based on a first drive input signal (also referred to as drive signal DH_ON") on drive input DH_ON. The first drive output signal may be configured to change a state of high-side switching transistor 18 (e.g., turn high-side switching transistor 18 on and off). Similarly, drive circuit 12L (also referred to as a "low-side driver" or "second drive circuit") includes a drive input DL_ON and a drive output GL (also referred to as a "drive terminal") that is coupled to the gate (also referred to as a "control terminal") of low-side switching transistor 19. During operation, drive circuit 12L produces a second drive output signal (also referred to as drive signal GH") on drive output GH based on a second drive input signal (also referred to as drive signal DL_ON) on drive input DL_ON. The second output drive signal may be configured to change a state of low-side switching transistor 19 (e.g., turn low-side switching transistor 19 on and off).

In an example, when drive signal DH_ON is asserted (either active high or active low), drive circuit 12H increases the voltage of drive signal GH such that high-side switching transistor 18 is turned on. When high-side switching transistor 18 is turned on, current is provided to load 20 and output node SH via the source (also referred to as an "output terminal") of high-side switching transistor 18. When DH_ON is de-asserted, drive circuit 12H decreases the voltage of drive signal GH such that high-side switching transistor 18 is turned off. Similarly, when drive signal DL_ON is asserted (either active high or active low), drive circuit 12L increases the voltage of drive signal GL such that low-side switching transistor 19 is turned on. When low-side switching transistor 19 is turned on, current is drawn from load 20 and output node SH via the drain (also referred to as an "output terminal") of low-side switching transistor 19. When drive signal DL_ON is de-asserted, drive circuit 12L decreases the voltage of drive signal GL such that low-side switching transistor 19 is turned off. In embodiments that utilize p-channel or PNP devices, the various drive signals would decrease in voltage to turn-on the switching transistors and increase in voltage to turn-off the switching transistors.

In some embodiments, drive signals DH_ON and DH_OFF are asserted in an alternating manner such that only one of high-side switching transistor 18 and low-side switching transistor 19 are active at one particular time. The generation of drive signals DH_ON and DH_OFF may be performed external to integrated circuit 11 or more may be performed on circuitry disposed on integrated circuit 11. Such drive signal generation circuitry may include, but is not limited to, pulse-width modulation circuitry, pulse frequency modulation circuitry, non-overlapping signal generation circuitry, and other circuitry known in the art configured to generate drive signals. Drive circuit 12H and drive circuit 12L may be implemented using switching transistor drivers known in the art, and drive signals GH and GL may be adapted to the particular transistor technology used to implement high-side switching transistor 18 and low-side switching transistor 19.

In various embodiments, high-side switching transistor 18 and low-side switching transistor 19 may be implemented, for example, using transistors such as IGBT transistors, MOS transistors (NMOS and/or PMOS), bipolar transistors, or other types of transistors. In some embodiments, high-side switching transistor 18 and low-side switching transistor 19 may be power IGBTs, power MOSFETs or power bipolar transistors to support high current and high power applications. In some embodiments, high-side switching transistor 18 and low-side switching transistor 19 may operate as switching transistors used in a switched mode power supply or to drive a motor. In some embodiments, switching system 10 may be adapted to support driving a single switching transistor. For example, drive circuit 12H and high-side switching transistor 18 may be omitted or drive circuit 12L and low-side switching transistor 19 may be omitted.

Drive circuits 12H and 12L may be implemented using drive circuit architectures known in the art, and may include auxiliary and support circuitry such as buffers, level shifters, isolation and circuits as is described in more detail in with respect to embodiments herein. In some embodiments, drive circuit 12H may be implemented using floating high-side drive circuitry known in the art. Drive circuit 12L may be implemented as a low-side driver.

In various embodiments, monitoring circuit 22 monitors an output signal (also referred to as "output signal SH") on output node SH of the half-bridge driver. Monitoring circuit 22 may be implemented, for example, using a comparator circuit known in the art as is described in more detail below. In some embodiments, the comparator circuit compares a voltage at output node SH with a reference voltage (not shown) and provides an output COMP based on the comparison. The reference voltage may be optionally derived from power supply voltage VDD supplied to high-side switching transistor 18 using, for example, a voltage divider circuit.

Time measuring circuit 24 is configured to measure relative time delays between edge transitions of output signal SH (via monitoring circuit 22) and various drive signals associated with drive circuits 12H and 12L. In the example illustrated in FIG. 1A, time measuring circuit 24 is coupled to drive inputs DH_ON and DL_ON and to output COMP of monitoring circuit 22. In various embodiments, time measuring circuit 24 may measure the relative time delay between edge transitions on any combination of drive signal DH_ON, drive signal DL_ON and output signal SH. In some embodiments, time measuring circuit 24 may be coupled to drive outputs GH and SL instead of to drive inputs DH_ON and DL_ON. In other embodiments, time measuring circuit 24 may be coupled to drive signals internal to drive circuits 12H and 12L instead of to drive inputs DH_ON and DL_ON. Thus, in various embodiments, the timing of drive signals anywhere within the signal path of drive circuits 12H and 12L may be compared with each other or to output signal SH. As such, drive signals DH_ON, DL_ON, GH and GL may be generically referred to as "drive signals." In the description herein, a drive signal within the signal path of drive circuit 12H may be referred to as a "first drive signal," and a drive signal within the signal path of drive circuit 12L may be referred to as a "second drive signal." In various embodiments, the output of time measuring circuit 24 comprises a value proportional to the relative timing between the first drive signal, the second drive signal and/or output signal SH. This output value may be a digital word representative or the time delay or may be an analog voltage representative of the time delay.

In some embodiments, time measuring circuit 24 may be implemented using digital circuitry, such as one or more digital counters, as is described with respect to embodiments below. In alternative embodiments, time measuring circuit 24 may implemented using analog and/or mixed signal circuitry. For example, various time periods could be measured by charging a capacitor between detected edge transitions such that the resulting voltage on the capacitor is proportional to the time between detected edge transitions.

In various embodiments, analysis circuit 26 is configured to determine whether one or more time delays measured by time measuring circuit 24 meet predetermined criteria. In some embodiments, the measured time delays between various signals may be compared to one or more predetermined thresholds and/or may be compared to a predetermined timing window. When the one or more measured time delays are determined to be outside of the predetermined timing window and/or do not meet the criteria defined by the one or more predetermined thresholds (e.g., the measured time exceeds the threshold or does not exceed the threshold), analysis circuit 26 may assert error signal ERROR. In some embodiments, error signal ERROR may be composed of a plurality of separate error signals that each indicates the presence of a different error condition. In some embodiments, each error signal may be associated with a different time measurement performed by time measuring circuit 24. In various embodiments, error signal ERROR may be used by integrated circuit 11 or switching system 10 as an indication that a failure has occurred within switching system 10. Such a failure may include, but are not limited to timing errors, signal faults, shorted or open pins. Upon assertion of signal ERROR, integrated circuit 11 or switching system 10 may set high-side switching transistor 18 and/or low-side switching transistor 19 in a predetermined state. For example, the predetermined state may be that one or both of high-side switching transistor 18 or low-side switching transistor 19 are shut-off.

In some embodiments, analysis circuit 26 may perform further analysis of the time delays measured by time measuring circuit 24. For example, in some embodiments, analysis circuit 26 may count the number of times that a measured time delay does not meet the criteria established by the predetermined time thresholds and/or measurement windows, and assert error signal ERROR when the counted number of times exceeds a predetermined value. In further embodiments, analysis circuit 26 (or other circuitry within integrated circuit 11 or switching system 10) may utilize the time delays measured by time measuring circuit 24 to provide other system information besides notification of a failure condition. For example, in some embodiments, the measured time delays may be used to determine the time during which current is freewheeling within high-side switching transistor 18 or low-side switching transistor 19.

Figure 1B:
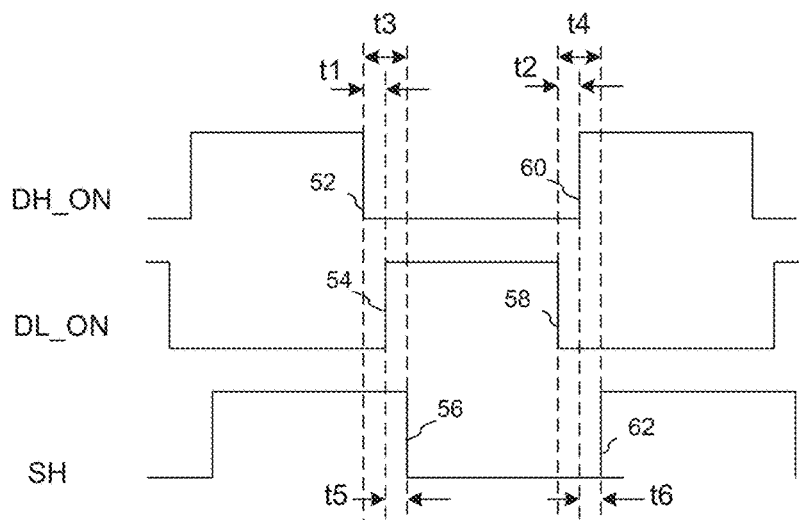
FIG. 1B illustrates a timing diagram associated with the embodiment switching system of FIG. 1A.

FIG. 1B illustrates a timing diagram showing the relationship between drive signal DH_ON, drive signal DL_ON, and output signal SH produced by integrated circuit 11, high-side switching transistor 18 and low-side switching transistor 19 of switching system 10 shown in FIG. 1A. It should be understood that while drive signals DH_ON and DL_ON are shown in FIG. 1B as being active high signals for convenience of illustration, active-low signals could be used in some embodiments. During operation, output signal SH is pulled low by first deactivating high-side switching transistor 18 by de-asserting drive signal DH_ON at edge 52. In various embodiments, de-asserting drive signal DH_ON causes drive circuit 12H to decrease the voltage of drive output GH to the gate of high-side switching transistor 18, which results in high-side switching transistor 18 being shut-off, and a high-impedance condition formed at the drain of high-side switching transistor 18.

In some embodiments, drive signal DH_ON is de-asserted during an optional dead-zone time interval of t1 (also referred to as a "sixth time delay") prior to asserting drive signal DL_ON in order to prevent shoot-though current in high-side switching transistor 18 and low-side switching transistor 19. Dead-zone time interval t1 may be generated using a non-overlapping signal generator circuit known in the art. After dead-zone time interval of t1, drive signal DL_ON is asserted at edge 54 (also referred to as a "second input edge transition"), which causes drive circuit 12L to increase the voltage of drive output GL to the gate of low-side switching transistor 19, and results in low-side switching transistor 19 being turned-on and a low-impedance current path formed between ground and output SH. Once this low-impedance current path is formed, the output voltage of signal SH decreases to ground at edge 56 (also referred to as a "second output edge transition"). The delay time t5 (also referred to as a "second time delay") between the time that drive signal DL_ON is asserted at edge 54 and the time output signal SH transitions to ground at edge 56 may also be referred to a "second delay time" and represents the switch-on time of low-side switching transistor 19 including the reaction time of drive circuit 12L. The delay time t3 (also referred to as a "third time delay") between the time that drive signal DH_ON is de-asserted edge 52 ("also referred to as a "third input edge transition") and the time output signal SH transitions to ground at edge 56 represents the dead time and the switch-on time of low-side switching transistor 19 including the reaction time of drive circuit 12L. Output signal SH may stay de-asserted for a prescribed period of time after edge 56.

To re-assert output signal SH, drive signal DL_ON is de-asserted at edge 58 (also referred to as a "fourth input edge transition") during an optional dead-zone time interval of t2 prior to asserting drive signal DH_ON in order to prevent shoot-though current. Similarly to dead-zone time interval t1, dead-zone time interval t2 (also referred to as a "fifth time delay") may also be generated using non-overlapping signal generator circuits known in the art. After dead-zone time interval t2, drive signal DH_ON is asserted at edge 64 (also referred to as a "first input edge transition"), which causes drive circuit 12L to increase the voltage of drive output GH to the gate of high-side switching transistor 18, and results in high-side switching transistor 18 being turned-on and a low-impedance current path formed between power supply VDD and output SH. Once this low-impedance current path is formed, the output voltage of signal SH increases to the voltage of power supply VDD at edge 62 (also referred to as a "first output edge transition"). The delay time t6 (also referred to as a "first time delay") between the time that drive signal DH_ON is asserted at edge 6o and the time output signal SH transitions to the voltage at power supply VDD at edge 62 may also be referred to a "first delay time" and represents the switch-on time of high-side switching transistor 18 including the reaction time of drive circuit 12H. The delay time t4 (also referred to as a "fourth time delay") between the time that drive signal DL_ON is de-asserted edge 58 and the time output signal SH transitions to the voltage at power supply VDD at edge 62 represents the dead time and the switch-on time of high-side switching transistor 18 including the reaction time of drive circuit 12H. Output signal SH may stay asserted for a prescribed period of time after edge 62. The length of time that output signal SH stays asserted may be determined, for example, according to a pulse-width and duty cycle determined by a pulse-width modulation (PWM) circuit or a pulse-frequency (PFM) modulation circuit.

In various embodiments, the delay time t6 ("first delay time") and delay time t5 ("second delay time") may be measured, monitored, and analyzed using monitoring circuit 22, time measuring circuit 24 and analysis circuit 26 in order to determine whether the time delays between the assertion of drive signals DH_ON and DL_ON and the change in output signal SH meet predefined timing criteria. Failure to meet these predefined timing criteria may be indicative, for example, of a short circuit between a drain of a source, an open circuit of a gate pin, a short circuit of a gate pin to a source pin or to ground, a short circuit of a gate pin to a drain pin or to power supply VDD, or an open circuit of a source or drain pin of either high-side switching transistor 18 or low-side switching transistor 19. By monitoring delay time t6 ("first delay time") and t5 ("second delay time"), a fast decision can be made to deactivate drive signal GH and GL This deactivation may entail configuring drive circuits 12H and 12L to respectively turn off high-side switching transistor 18 and low-side switching transistor 19. In some instances, for example when the gate of high-side switching transistor 18 or low-side switching transistor 19 has a short circuit, the output of drive circuit 12H and/or 12L may be configured to attain a high-impedance state.

In various embodiments, time measuring circuit 24 is configured to measure one or more delay times t1, t2, t3, t4, t5 and t6 depending on the implementation of switching system 10 and its implementation. If delay time t3 is less than delay time t1 (e.g., output signal SH transitions low before drive signal DL_ON is asserted), this indicates that freewheeling current is flowing in low-side switching transistor 19 (e.g. a current that forward biases the body diode of low-side switching transistor 19). Similarly, if delay time t4 is less than delay time t2 (e.g., output signal SH transitions high before drive signal DL_ON is asserted), this indicates that freewheeling current is flowing in high-side switching transistor 18 (e.g. a current that forward biases the body diode of high-side switching transistor 18). Such freewheeling currents may occur, for example, in switching systems where load 20 is inductive, such as in motors and switched mode power supplies. In some embodiments, the direct measurement of any one of delay times t1, t2 and t3 can be omitted by using the relationship of t3=t1+t2 to derive the omitted delay time. Similarly, the direct measurement of any one of delay times t4, t5 and t6 can be omitted by using the relationship of t4=t2+t6 to derive the omitted delay time. In one example, delay times t3, t4, t5 and t6 are directly measured by time measuring circuit 24, and delay times t1 and t2 are determined as derived values. For example, delay time t1 may be derived by subtracting delay time t5 from delay time t3, and delay time t2 can be derived by subtracting delay time t6 from delay time t4. In another example, delay time t1 and delay time t2 are measured and/or derived by the signal generator, such as a PWM signal generator, that produces drive signals DH_ON and DL_ON. Alternatively, all of delay times t1, t2, t3, t4, t5 and t6 may be measured directly.

FIG. 2A illustrates embodiment switching system 100, which is a more specific implementation of switching system 10 shown in FIG. 1A. Switching system 100 includes integrated circuit 102 configured to drive high-side switching transistor 18 and low-side switching transistor 19. As shown, integrated circuit 102 includes high-side driver 108 coupled to the gate of high-side switching transistor 18 and low-side driver no coupled to the gate of low-side switching transistor 19. Control logic 104 is configured to generate drive signals DH_ON and DL_ON, and optional level shifter 106 is configured to shift the signal levels of drive signals DH_ON and DL_ON to respective signal levels of driver inputs DH and DL using level shifting circuits and methods known in the art. In one embodiment, drive signals DH_ON and DL_ON are logic signals that switch between 0 V and a logic high level such as 1.2 V, 2.0 V, 3.3 V, 5.0 V or other logic high levels. In some embodiments, the interface between level shifter 106 and high-side driver 108 and the interface between level shifter 106 and low-side driver no are current interfaces, in which driver inputs DH and DL are configured to receive currents. In some embodiments, the current levels received by driver inputs DH and DL may vary between about 0 mA and 3 mA depending on the logic level of drive signals DH_ON and DL_ON such that a peak current is configured to toggle the state of high-side driver 108 or low-side driver no. It should be understood that these logic/signal levels are just a few of many possible logic/signal levels that could be used in embodiment implementations. In some embodiments, level shifters 106 may include galvanic isolation elements, such as one or more transformer to provide DC isolation between the inputs and outputs of level shifter 106. Other interface circuits and methods known in the art could be used including, but not limited to a voltage interface or an interface, in which the state of high-side driver 108 or low-side driver 110 is determined by comparing the magnitude of the signals of driver inputs DH and DL to a predetermined threshold. In some embodiments, high-side driver 108 and portions of level shifter 106 devoted to the level shifting of drive signal DH_ON correspond to drive circuit 12H, and low-side driver no and portions of level shifter 106 devoted to the level shifting of drive signal DL_ON correspond to drive circuit 12L shown in FIG. 1A.

Control logic 104 may be configured to provide control functionality of circuit 102 as well as provide a pulse-width modulated signal and/or a pulse-frequency modulated signal to level shifter 106. Digital interface 132 is shown coupled to a digital bus DBUS having n signal pins and may be used to control, configure and monitor the operation of integrated circuit 102. In various embodiments, digital interface 132 may be a serial bus interface circuit, a parallel bus interface circuit, and/or may comply with any bus standard including, but not limited to SPI, CAN, I2C, LVDS, and USB. Accordingly, the number n of signal pins of digital bus DBUS may be any number appropriate to the implemented bus protocol. In some embodiments, pulse-width modulation or pulse-frequency modulation parameters, such duty cycle, pulse-width, frequency, and other parameters may be received from digital bus DBUS via digital interface 132 and transferred to registers within control logic 104 in order to control the generation of drive signals DH_ON and DL_ON.

Integrated circuit 102 also includes voltage divider 112, comparator 114 and diagnostic circuit 116. During operation, comparator 114 compares the voltage of signal SH to a comparison voltage level VDH/n that is generated by voltage divider 112 to produce comparison signal COMP. By deriving the comparison voltage level VDH/n from the voltage of the power supply node VDH coupled to the drain of high-side switching transistor 18, a predetermined threshold voltage of comparator 114 that tracks the signal level of output node SH can be generated. In alternative embodiments, the threshold voltage of comparator 114 can be generated using other circuits that provide a threshold voltage that does not necessarily track the voltage of supply node VDH. For example, a fixed voltage generator such as bandgap voltage generator or a voltage divider coupled to another voltage node besides power supply node VDH could be used depending on the particular system and its specifications. Comparator 114 may be implemented using comparator circuits known in the art. For example, in some embodiments, comparator 114 may be implemented using a switch capacitor comparator circuit.

Comparison signal COMP, as well as drive signals DH_ON and DL_ON are analyzed by diagnostic circuit 116 to determine their relative timings and determine whether the relative timings meet predefined criteria. In various embodiments, comparator 114 corresponds to monitoring circuit 22 and diagnostic circuit 116 incorporates the functionality of both time measuring circuit 24 and analysis circuit 26 shown in FIG. 1A. In some embodiments, optional evaluation current source 130 is coupled to output node SH to pre-charge output node SH with current IEVAL in order to support functional testing as described in further detail below. In some embodiments, comparator 114 and diagnostic circuit 116 are clocked using a high frequency internal clock signal in order to provide high-resolution timing measurements. In one example embodiments, this high frequency internal clock signal has a frequency of about 166 MHz to provide about 6 ns of timing resolution. In alternative embodiments, other frequencies may be used depending on the particular embodiment and its specifications.

Optional current sense feedback circuit 128 may be included to monitor the voltage across resistor 124 in order to monitor the current through low-side switching transistor 19. Current sense feedback circuit 128 may include current monitoring circuitry known in the art, such as one or more amplifiers, one or more comparators and/or an analog-to-digital converter. The output CSOUT of current sense feedback circuit 128 is coupled to control logic 104, and may be used by control logic 104 as a feedback input for switch control algorithms known in the art.

Optional power supply circuit 118 may be included to provide local power voltages to the various circuits of integrated circuit 102. In various embodiments, these local power supply voltages may be generated using voltage regulation circuits known in the art, such as linear voltage regulators and/or may include voltage boosting circuits known in the art, such as charge pumps, and the like. In some embodiments, power supply circuit 118 may generate a negative supply voltage for use by level shifter 106 and low side driver 110. These negative voltages may be used, for example, to bias the body of MOSFETs disposed on integrated circuit 102 and/or may be used to provide a negative voltage for assertion at drive output GL. Power supply circuit 118 may transfer power to the local circuits from power terminal VS and/or via power terminal VDH.

FIG. 2B illustrates an example implementation of voltage divider 112. As shown, voltage divider 112 is implemented as a resistive voltage divider that includes resistors 150 and 152. The output VDH/n of voltage divider 112 provides a divided voltage based on the ratio $R_{152}/(R_{150}+R_{152})$ of resistors 150 and 152, where $R_{150}$ is the resistance of resistor 150 and $R_{152}$ is the resistance of resistor 152. In alternative embodiments, voltage divider 112 may be implemented using other voltage divider circuit known in the art.

FIG. 2C illustrates an example implementation of evaluation current source 130. As shown, evaluation current source 130 includes test current source 154 configured to charge output node SH when high-side current source signal IP_ON is asserted, and test current source 156 configured to discharge output node SH when low-side current source signal IL_ON is asserted. Test current sources 154 and 156 may be implemented using current source circuits known in the art. It should be understood that the implementation of evaluation current source 130 shown in FIG. 2C is just one of many possible implementations of evaluation current source 130 that could be utilized in embodiments of the present invention.

Figure 2D:
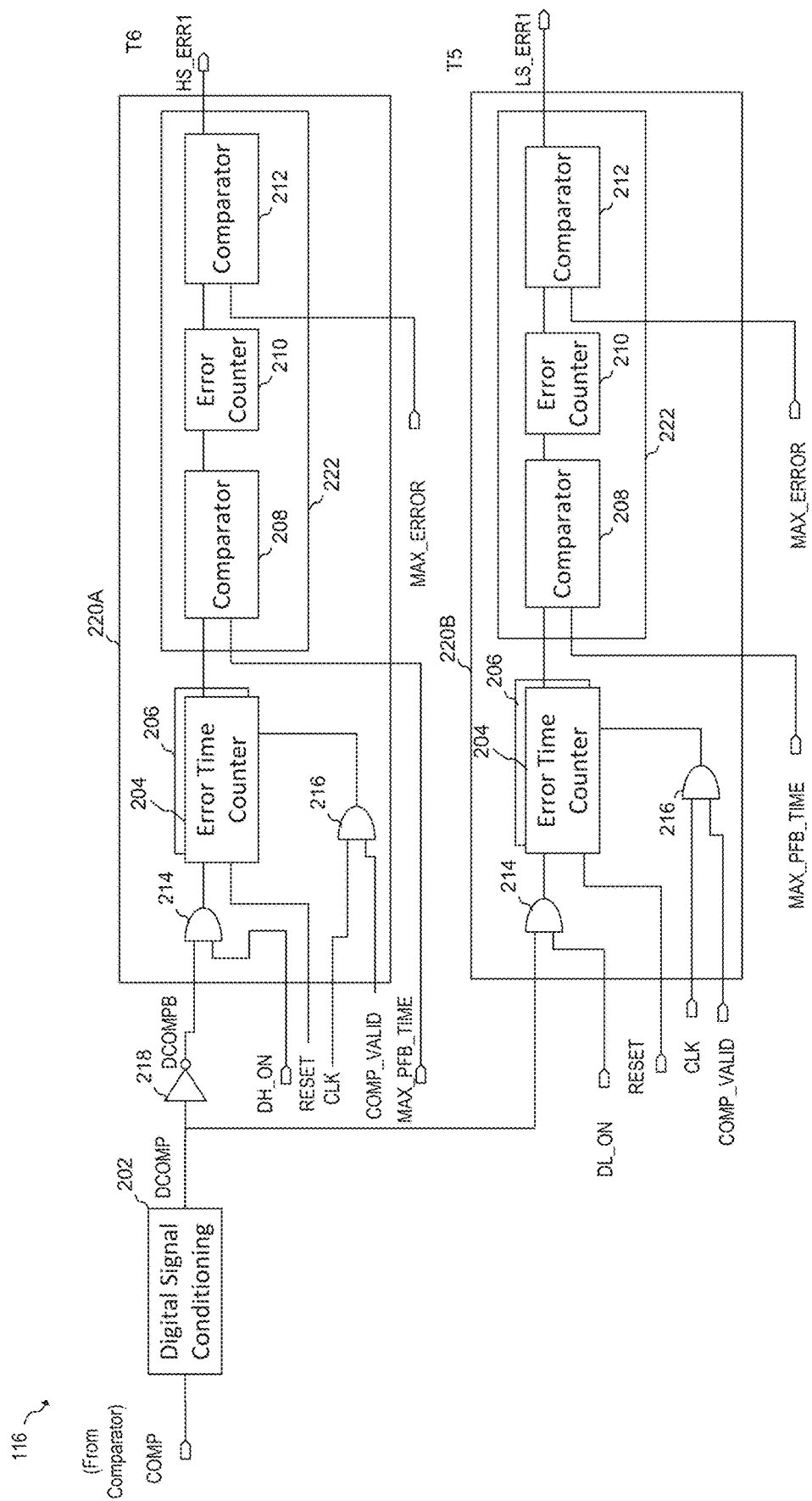
FIGS. 2D, 2E and 2F illustrate an embodiment diagnostic circuit.

FIG. 2D illustrates an example implementation of diagnostic circuit 116 shown in FIG. 2A that produces a digital comparator signal DCOMP based on output COMP of comparator 114. As shown, diagnostic circuit 116 includes optional digital signal conditioning circuit 202 that is configured to qualify and/or condition the output COMP of comparator 114. Digital signal conditioning circuit 202 may include digital de-glitching circuitry known in the art that is configured to reduce or eliminate metastability or chatter at when the input to comparator 114 approaches its predefined threshold. Alternately or in addition to de-glitching circuitry, digital signal conditioning circuit 202 may include blanking circuitry that prevents signal DCOMP from transitioning at times during which output COMP of comparator 114 is not valid, and/or during times in the PWM cycle that are prone to high levels of noise or disturbance. Such high levels of noise or disturbance may be caused, for example, by a combination of transistor switching and stray inductance that causes voltage and current spikes at the power supply nodes. In some cases, voltage spikes at the power supply as high as 20 V may affect the performance of comparator 114 and appear as glitches at output COMP of comparator 114.

Figure 2E:
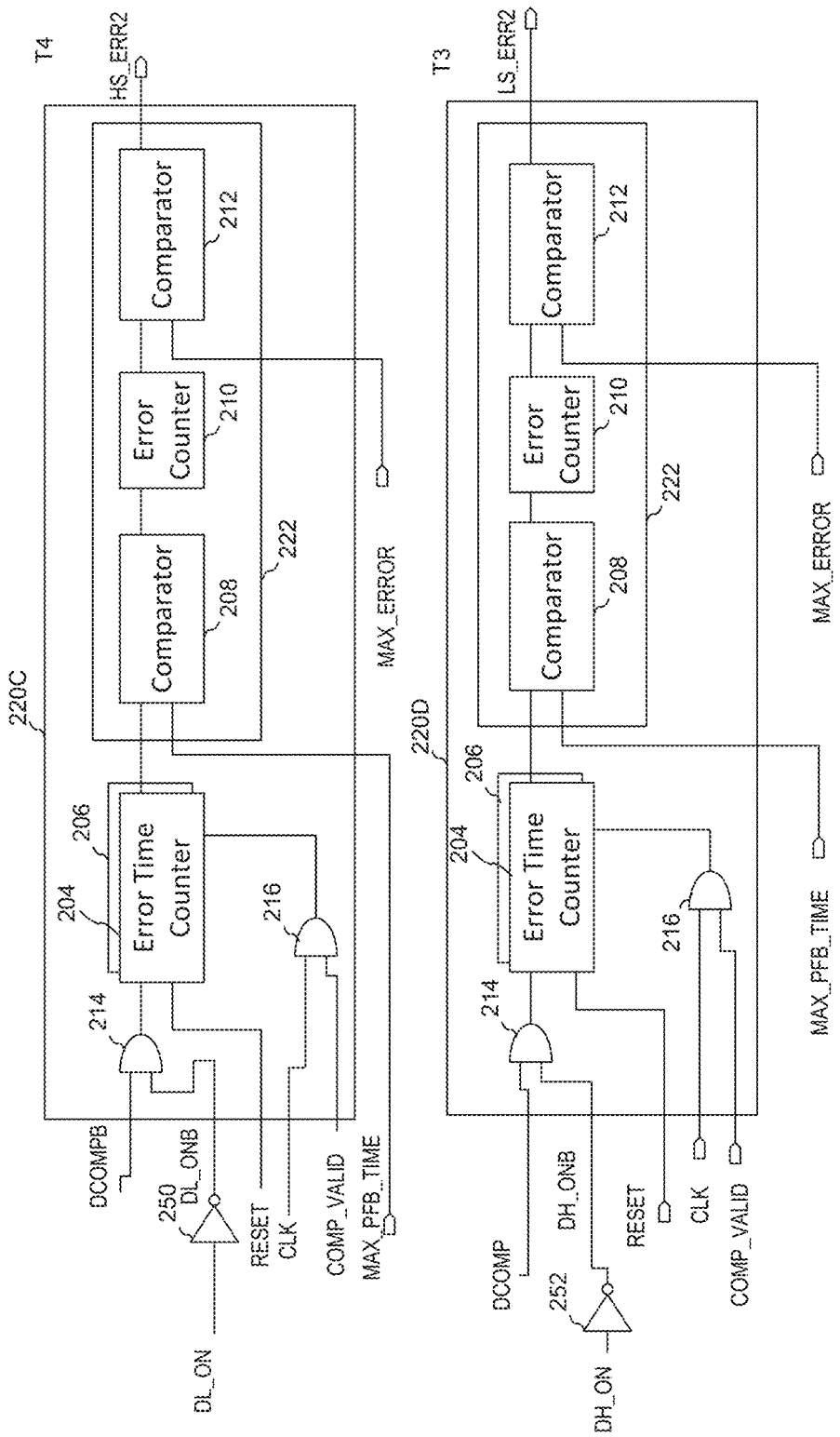
Figure 2F:
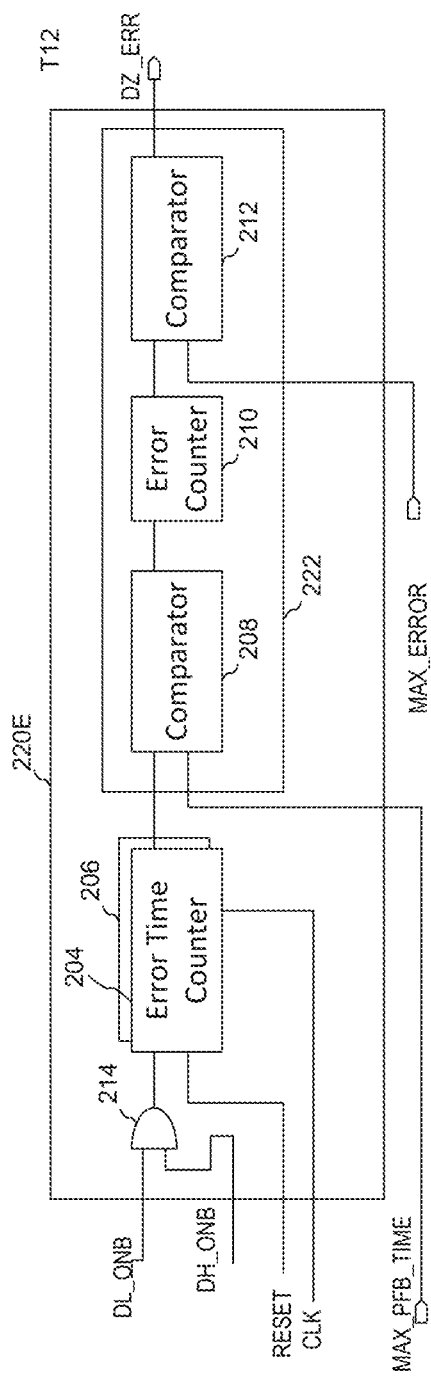

FIG. 2D further illustrates timing analysis circuit 220A and timing analysis circuit 220B. Timing analysis circuit 220A is configured to measure and analyze the time delay between the assertion of drive signal DH_ON and the rising edge transition of output signal SH, which corresponds to time delay t6 shown in FIG. 1B; and timing analysis circuit 220B is configured to measure and analyze the time delay between the assertion of drive signal DL_ON and the rising edge transition of output signal SH, which corresponds to time delay t5 shown in FIG. 1B. FIG. 2E further illustrates timing analysis circuit 220C and timing analysis circuit 220D. Timing analysis circuit 220C is configured to measure and analyze the time delay between the de-assertion of drive signal DL_ON and the rising edge transition of output signal SH, which corresponds to time delay t4 shown in FIG. 1B; and timing analysis circuit 220D is configured to measure and analyze the time delay between the de-assertion of drive signal DH_ON and the rising edge transition of output signal SH, which corresponds to time delay t3 shown in FIG. 1B. FIG. 2F further illustrates timing analysis circuit 220E that is configured to measure and analyze the dead-time when both drive signals DL_ON and DL_OFF are de-asserted. In various embodiments, diagnostic circuit 116 may include one or more timing analysis circuits 220A, 220B, 220C, 220D and/or 220E depending on the particular embodiment and its specifications. For example, in embodiments in which control logic 104 is configured to provide a measurement of the dead-time between drive signals DL_ON and DL_OFF, analysis circuits 220E configured to measure the dead-time may be omitted.

As shown in FIGS. 2D, 2E and 2F, each of timing analysis circuits 220A, 220B, 220C, 220D and/or 220E includes an error time counter 204 and shadow register 206 that measures and stores a time delay between applicable two signals at the input of AND gate 214, and an analysis circuit 222 that performs an analysis of the time delay measured by error time counter 204. In various embodiments, error time counter 204, shadow register 206 and AND gate 214 correspond to time measuring circuit 24 and analysis circuit 222 corresponds to analysis circuit 26 shown in FIG. 1A.

Turning to FIG. 2D, timing analysis circuit 220A is configured to measure and analyze the time delay between the assertion of drive signal DH_ON and the rising edge transition of output signal SH, which corresponds to time delay t6 shown in FIG. 1B. During operation, error time counter 204 is configured to increment when the output of AND gate 214 is high. This condition is met when drive signal DH_ON is asserted and digital comparator signal DCOMP is low (e.g., as a result of output signal SH being low). In the illustrated embodiment, digital comparator signal DCOMP is logically inverted by inverter 218 to form inverted digital comparator signal DCOMPB prior to its being input to timing analysis circuit 220A and AND gate 214. In alternative embodiments, AND gate 214 and/or inverter 218 may be replaced by another logically equivalent circuit or function.

In some embodiments, the contents of error time counter 204 is transferred to optional shadow register 206 for use by control logic 104 and/or for use by later stages in analysis circuit 222. Digital comparator 208 compares the output of error time counter 204 (or shadow register 206) to a predefined threshold MAX_PFB_TIME and indicates an error when the output of error time counter 204 exceeds the predefined threshold. In some embodiments, optional error counter 210 is incremented each time digital comparator 208 indicates an error, and optional digital comparator 212 compares the number of errors counted by error counter 210 to a predefined threshold MAX_ERROR. When the number of errors counted by error counter 210 exceeds predefined threshold MAX_ERROR, error condition HS_ERR1. (also referred to as a "first error condition") is indicated. In embodiments that do not utilize error counter 210 and comparator 212, error condition HS_ERR1 may be indicated whenever digital comparator 208 indicates that the value of error time counter 204 exceeds predefined threshold MAX_PFB_TIME.

In various embodiments, error time counter 204 is clocked using a high-frequency clock signal CLK that is optionally gated by signal COMP_VALID, which is asserted whenever the output of comparator 114 is deemed to be valid. As shown, this gating is performed by AND gate 216, however, any logically equivalent circuit may be used to perform the gating. In some embodiments, clock signal CLK can be directly applied to error time counter 204 and AND gate 216 may be omitted. During operation, signal RESET may be used to reset error time counter 204 and transfer the contents of error time counter 204 to shadow register 206.

In embodiments of the present invention, error time counter 204 and error counter 210 may be implemented using digital counter circuits known in the art, shadow register 206 may be implemented using digital registered circuits known in the art (such as flip-flops or memory circuits), and comparators 208 and 212 may be implemented using digital comparator circuits known in the art.

Timing analysis circuit 220B is configured to measure and analyze the time delay between the assertion of drive signal DL_ON and the falling edge transition of output signal SH, which corresponds to time delay t5 shown in FIG. 1B. As shown, digital comparator signal DCOMP and drive signal DL_ON is coupled to the inputs of AND gate 214 of timing analysis circuit 220B. Accordingly, error time counter 204 increments whenever both digital comparator signal DCOMP and drive signal DL_ON is asserted. Operation of timing analysis circuit 220B otherwise proceeds as described above with respect to timing analysis circuit 220A as described above. When the number of counted errors exceeds predetermined error threshold MAX_ERROR or when digital comparator 208 detects an error (in embodiments that do not utilize optional error counter 210 and comparator 212), error condition LS_ERR1. (also referred to as a "second error condition") is indicated.

Timing analysis circuit 220C shown in FIG. 2E is configured to measure and analyze the time delay between the de-assertion of drive signal DL_ON and the rising edge transition of output signal SH, which corresponds to time delay t4 shown in FIG. 1B. As shown, inverted digital comparator signal DCOMP and inverted drive signal DL_ONB is coupled to the inputs of AND gate 214 of timing analysis circuit 220C. In some embodiments, inverted drive signal DL_ONB may be generated using inverter 250, however, any logically equivalent circuit or method to invert drive signal DL_ON may be used. Accordingly, error time counter 204 increments whenever digital comparator signal DCOMP drive signal DL_ON are both de-asserted. Operation of timing analysis circuit 220C otherwise proceeds as described above with respect to timing analysis circuit 220A. When the number of counted errors exceeds predetermined error threshold MAX_ERROR or when digital comparator 208 detects an error (in embodiments that do not utilize optional error counter 210 and comparator 212), error condition HS_ERR2 is indicated.

Timing analysis circuit 220D shown in FIG. 2E is configured to measure and analyze the time delay between the de-assertion of drive signal DH_ON and the falling edge transition of output signal SH, which corresponds to time delay t3 shown in FIG. 1B. As shown, digital comparator signal DCOMP and inverted drive signal DH_ONB is coupled to the inputs of AND gate 214 of timing analysis circuit 220D. In some embodiments, inverted drive signal DH_ONB may be generated using inverter 252, however, any logically equivalent circuit or method to invert drive signal DH_ON may be used. Accordingly, error time counter 204 increments whenever digital comparator signal DCOMP is asserted and drive signal DH_ON is de-asserted. Operation of timing analysis circuit 220D otherwise proceeds as described above with respect to timing analysis circuit 220A. When the number of counted errors exceeds predetermined error threshold MAX_ERROR or when digital comparator 208 detects an error (in embodiments that do not utilize optional error counter 210 and comparator 212), error condition LS_ERR2 is indicated.

Timing analysis circuit 220E shown in FIG. 2F is configured to measure and analyze the length of the dead-zone between assertions of drive signal DL_ON and drive signal DL_OFF, which corresponds to time delays t1 and t2 shown in FIG. 1B. As shown, inverted drive signals DH_ONB and DL_ONB are coupled to the inputs of AND gate 214 of timing analysis circuit 220E. Accordingly, error time counter 204 increments whenever drive signal DH_ON and DL_ON are both de-asserted. Operation of timing analysis circuit 220E otherwise proceeds as described above with respect to timing analysis circuit 220A. When the number of counted errors exceeds predetermined error threshold MAX_ERROR or when digital comparator 208 detects an error (in embodiments that do not utilize optional error counter 210 and comparator 212), error condition DZ_ERR is indicated.

In various embodiments, shadow register 206 of one or more timing analysis circuits 220A, 220B, 220C, 220D and/or 220E, as well as one or more of error condition signals HS_ERR1, LS_ERR1, HS_ERR2, LS_ERR2, and DZ_ERR may be routed to control logic 104 in integrated circuit 102 shown in FIG. 2A for further analysis and/or to provide input to initiate error condition responses, such as turning off high-side switching transistor 18 and/or low-side switching transistor 19. In some embodiments, error condition data may be transmitted by and/or may be externally accessible via digital interface 132 in order to alert an external controller coupled to digital bus DBUS to the error condition. Alerting an external controller may be advantageous in situations where the measured relative timings are indicative of device drift that could potentially lead to a later system failure or an intermittent system failure.

In some embodiments, thresholds MAX_PFB_TIME and MAX_ERROR may be programmable via digital interface 132 and stored in a local register. Moreover, in some embodiments, one or more of timing analysis circuits 220A, 220B, 220C, 220D and/or 220E may have its own individual independent thresholds MAX_PFB_TIME and/or MAX_ERROR that could be configured to be different from each other. In some embodiments, each MAX_PFB_TIME and/or MAX_ERROR for each of the timing analysis circuits 220A, 220B, 220C, 220D and/or 220E may be individually and independently programmable via digital interface 132.

It should be appreciated the embodiments of FIGS. 2D, 2D and 2F are just a few examples of many possible ways to implement diagnostic circuit 116. In alternative embodiments, other circuits and methods may be used to measure and analyze relative timings in accordance with embodiments disclosed herein.

Figure 2G:
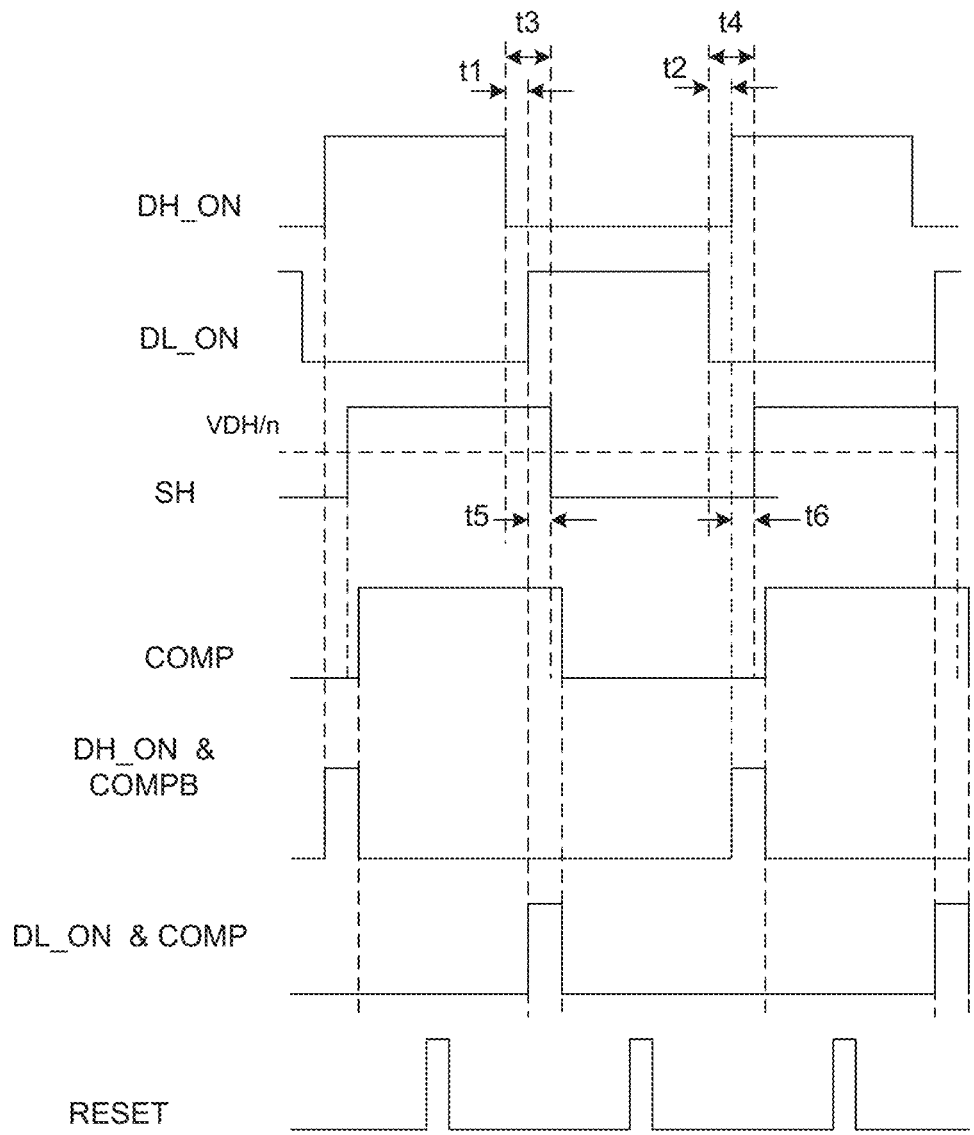
FIGS. 2G and 2H illustrate timing diagrams that illustrate the operation of the embodiment switching system of FIG. 2A.

FIG. 2G shows a timing diagram that illustrates the operation of timing analysis circuits 220A and 220B shown and described above with respect to FIG. 2D. Drive signals DH_ON, DL_ON and output signal SH are illustrated in a manner similar to FIG. 1B. FIG. 2G further shows comparison voltage level VDH/n, comparator output COMP, the output of AND gate 214 of timing analysis circuit 220A representing the logical function DH_ON & COMPB, the output of AND gate 214 of timing analysis circuit 220B representing the logical function DL_ON & COMP, and reset signal RESET that resets error time counter 204 and transfers the contents of error time counter 204 to shadow register 206. In an embodiment, error time counter 204 of timing analysis circuit 220A is incremented when the logical function DH_ON & COMPB is true, and error time counter 204 of timing analysis circuit 220B is incremented when the logical function DL_ON & COMP is true. As shown, signal RESET is pulse in the middle of each half cycle at a time when drive signal DH_ON is asserted, drive signal DL_ON is de-asserted and output signal SH is high, or at a time when drive signal DL_ON is asserted, drive signal DH_ON is de-asserted and output signal SH is low. Signal RESET may be generated by control logic 104 using digital logic systems and methods known in the art. For example, in one embodiment, signal reset may be generated using a state machine.

Figure 2H:
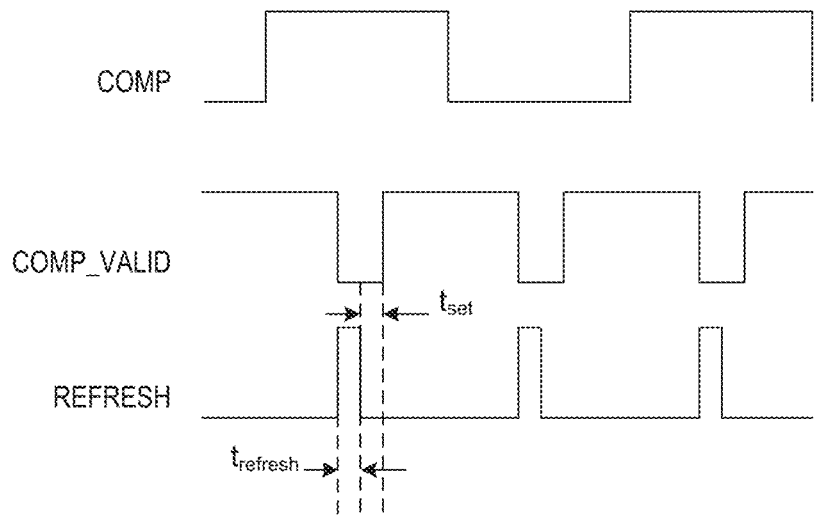

In embodiments in which comparator 114 is implemented using an analog comparator such as clocked comparator and/or a switched capacitor comparator, the clock to error time counter 204 may be activated only when the output of comparator 114 is valid. As shown in FIGS. 2D and 2E, this gating is implemented using AND gate 216 that uses gating signal COMP_VALID to gate clock signal CLK. FIG. 2H shows a timing diagram that illustrates a timing relationship of comparator output COMP with respect to gating signal COMP_VALID and signal REFRESH used to reset the internal circuitry comparator 114 prior to performing a comparison. As shown, signal REFRESH is pulsed for a duration of $t_{refresh}$ in the middle of each half period. As shown, gating signal COMP_VALID is de-asserted when signal REFRESH is asserted. After signal REFRESH has been asserted, gating signal COMP_VALID remains low for an additional duration $t_{set}$ to allow for additional comparator setting time after the comparator is refreshed. Signals COMP_VALID and REFRESH can be generated using digital circuits known in the art, for example using a finite state machine, a timing circuit and/or other digital circuitry.

In some embodiments, evaluation current source 130 can be used in conjunction with comparator 114 and diagnostic circuit 116 to provide a functional test and/or power-up test of switching system 100 prior to load 20 being coupled to high-side switching transistor 18 and low-side switching transistor 19 and/or prior to load 20 being activated. In such embodiments, evaluation current source 130 is used to pre-charge output node SH prior while high-side switching transistor 18 and low-side switching transistor 19 are in a high impedance state. Such a functional test could be performed, for example, during a manufacturing test and/or during a power-up or diagnostic test of switching system 100. In some embodiments, the functional test is performed when switching system 100 is operating in a test mode different from a normal operation mode.

Figure 3:
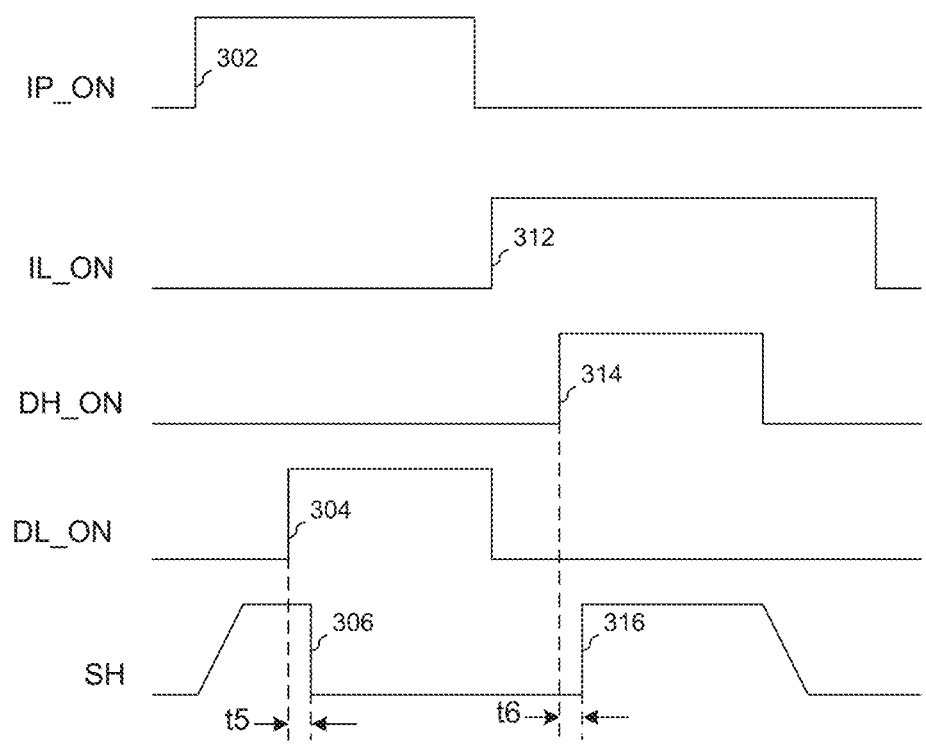
FIG. 3 illustrates a timing diagram showing the operation of a switching system during a functional test.

FIG. 3 illustrates a timing diagram that shows the operation of switching system 100 during such a functional test. As shown, the low-side signal path is tested by first asserting high-side current source signal IP_ON at edge 302, which activates high side test current source 154 shown in FIG. 2C and charges output node SH to a higher voltage. Once output node SH is charged, drive signal DL_ON is asserted at edge 304, which causes output signal SH to transition to a low voltage at edge 306. The delay time $t_5$ from edge 304 to edge 306 may be measured and qualified using timing analysis circuit 220B shown in FIG. 2D. Similarly, the high-side signal path is tested by first asserting low-side current source signal IL_ON at edge 312, which activates low-side current source 156 shown in FIG. 2C and discharges output node SH to a lower voltage. Once output node SH is discharged, drive signal DH_ON is asserted at edge 314, which causes output signal SH to transition to a higher voltage at edge 316. The delay time $t6$ from edge 314 to edge 316 may be measured and qualified using timing analysis circuit 220B shown in FIG. 2D.

Figure 4:
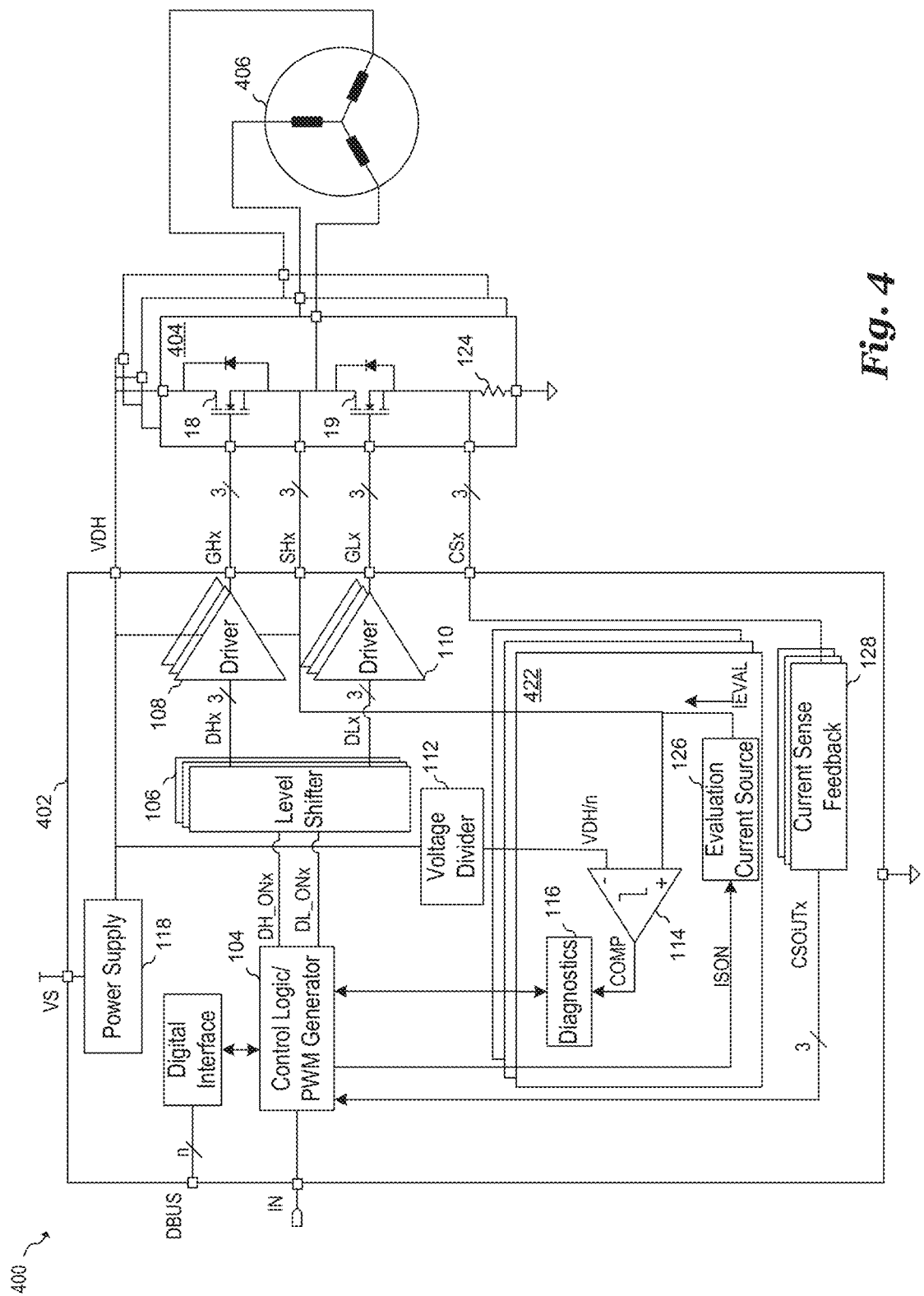
FIG. 4 illustrates a schematic of an embodiment motor system.

FIG. 4 illustrates a motor system 400 that includes integrated circuit 402 coupled to three-phase motor 406 via three half-bridge drivers 404. Integrated circuit 402 is similar to integrated circuit 102 shown in FIG. 2A in terms of structure and operation, with the exception that three parallel half-bridge driver channels (also referred to as "motor control circuits") are implemented instead of a single channel. For example, control logic 104 is configured to provide three channels of input drive signals represented by signals DH_ONx and DL_ONx. Three level shifters 106, three high-side drivers 108 and three low-side drivers no are provided to support the driving and activation of each of the three half-bridge drivers 404 via drive outputs GHx and GLx. Accordingly, three signal analysis circuits 422 provide monitoring and timing analysis of output signals SHx provided by half-bridge drivers 404, each of which include a high-side switching transistor 18, a low-side switching transistor 19 and an optional resistor 124 for current sensing. During operation, the high-side switching transistors 18 and low-side switching transistors 19 of the three half-bridge drivers 404 provide drive currents to three-phase motor 406. Each signal analysis circuit 422 includes a comparator 114, diagnostic circuit 116 and optional evaluation current source 126 that operate as described with respect to FIGS. 2A-H and FIG. 3 above. Current sense feedback is provided by three optional current sense feedback circuits 128.

In various embodiments, control logic 104 is configured to generate three-phase input drive signals DH_ONx and DL_ONx that are configured to drive three-phase motor 406 according to three-phase motor driving methods known in the art. In some embodiments, each phase of input drive signals DH_ONx and DL_ONx are configured to provide three-phase pulse-width modulated signals that provide motor drive signals be phase shifted about 120 degrees from each other. In some embodiments, each pulse-width modulated signal comprises a plurality of pulse cycles whose pulse-width and/or pulse density increases and decreases over a single motor drive cycle. In such embodiments, the peak pulse-width of each channel is shifted 120 degrees with respect to the other channels. In other embodiments, each pulse-width modulated signal comprises a single pulse cycle for a single motor drive cycle. In such embodiments, each single pulse cycle of each channel is shifted 120 degrees with respect to the other channels.

Figure 5:
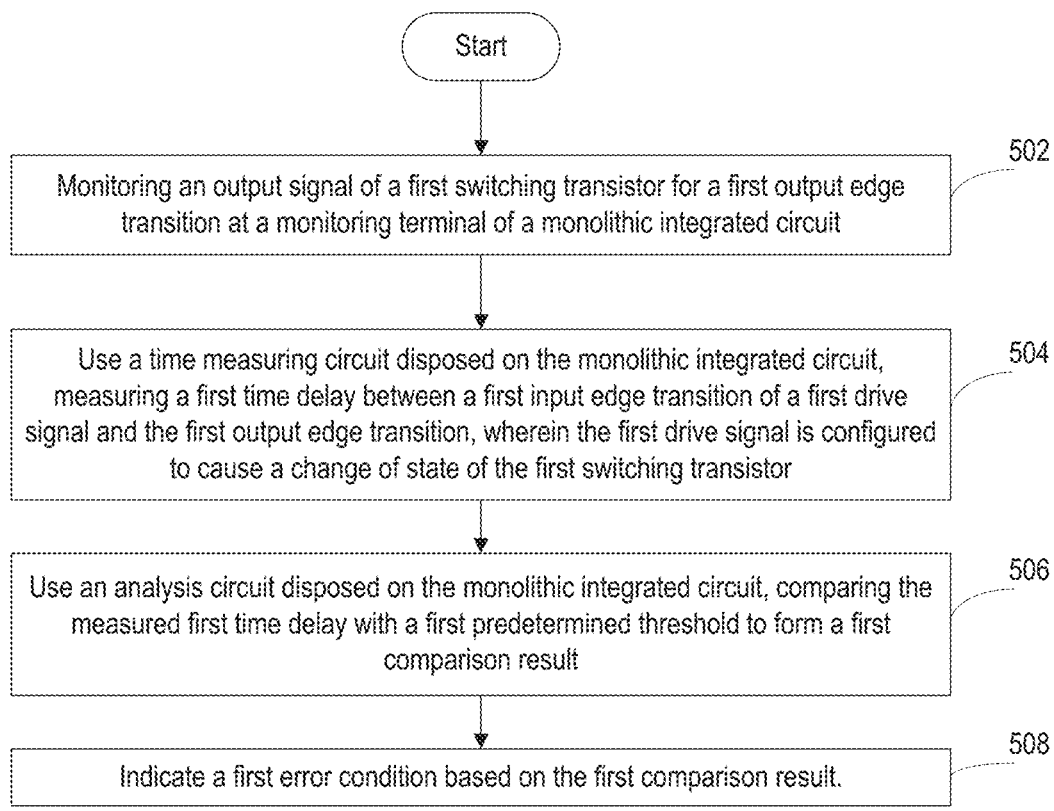
FIG. 5 illustrates a block diagram of an embodiment method.

FIG. 5 illustrates a block diagram of an embodiment method. In step 502, an output signal of a first switching transistor is monitored for a first output edge transition at a monitoring terminal of a monolithic integrated circuit using a monitoring circuit disposed on the monolithic integrated circuit. In some embodiments, the monitoring of the output signal may be performed using a monitoring circuit such as monitoring circuit 22 shown in FIG. 1A. In various embodiments, monitoring circuit 22 may be implemented using a comparator circuit such as comparator 114 shown in FIGS. 2A and 4. In such embodiments, the comparator may detect the first output edge transition by comparing a voltage of the output signal with a voltage threshold. In some embodiments, this voltage threshold may be generated using voltage divider circuit such as voltage divider 112 shown in FIGS. 2A, 2B and 4.

In step 504, a first time delay between a first input edge transition of a first drive signal and the first output edge transition is measured using a time measuring circuit disposed on the monolithic integrated circuit, such as time measuring circuit 24 shown in FIG. 1A and diagnostic circuit 116 shown in FIGS. 2A and 4. In some embodiments, time measuring circuit 24 and diagnostic circuit 116 may be implemented using a counter, such as error time counter 204 shown in FIGS. 2D-F. The first drive signal may be configured to cause a change of state of the first switching transistor, such as high-side switching transistor 18 and/or low-side switching transistor 19 shown in the various figures herein.

In step 506, the measured time delay is compared to a first predetermined threshold to form a first comparison result using an analysis circuit disposed on the monolithic integrated circuit, such as analysis circuit 26 shown in FIG. 1A and diagnostic circuit 116 shown in FIGS. 2A and 4. In some embodiments, analysis circuit 26 and diagnostic circuit 116 may be implemented using a comparator, such as digital comparator 208 shown in FIGS. 2D-F.

In step 508, a first error condition is indicated based on the first comparison result. In some embodiments, the error condition is indicated when the first measured time delay exceeds the first predetermined threshold. In further embodiments, the error condition is indicated when the first measured time delay exceeds the first predetermined threshold a first number of times. The generation of the error condition indication may be performed, for example, using analysis circuit 26 shown and described with respect to FIG. 1A and/or diagnostic circuit 116 shown and described with respect to FIGS. 2A, 2D, 2E, 2F and/or 4.

Embodiments of the present invention are summarized here. Other embodiments can also be understood from the entirety of the specification and the claims filed herein.

Example 1

A method including: using a monitoring circuit disposed on a monolithic integrated circuit, monitoring an output signal of a first switching transistor for a first output edge transition at a monitoring terminal of the monolithic integrated circuit; using a time measuring circuit disposed on the monolithic integrated circuit, measuring a first time delay between a first input edge transition of a first drive signal and the first output edge transition, where the first drive signal is configured to cause a change of state of the first switching transistor; using an analysis circuit disposed on the monolithic integrated circuit, comparing the measured first time delay with a first predetermined threshold to form a first comparison result; and indicating a first error condition based on the first comparison result.

Example 2

The method of example 1, further including: using the monitoring circuit, monitoring an output signal of a second switching transistor for a second output edge transition at the monitoring terminal; using the time measuring circuit, measuring a second time delay between a second input edge transition of a second drive signal and the second output edge transition, where the second drive signal is configured to cause a change of state of the second switching transistor; using the analysis circuit, comparing the measured second time delay with a second predetermined threshold to form a second comparison result; and indicating a second error condition based on the second comparison result.

Example 3

The method of example 2, further including: using the time measuring circuit, measuring at least one of: a third time delay between a third input edge transition of the first drive signal and the second output edge transition, where the third input edge transition occurs when the first drive signal is de-asserted; a fourth time delay between a fourth input edge transition of the second drive signal and the first output edge transition, where the fourth input edge transition occurs when the second drive signal is de-asserted; a fifth time delay between the fourth input edge transition and the first input edge transition; or a sixth time delay between the third input edge transition and the second input edge transition.

Example 4

The method of one of examples 1 to 3, further including driving a control terminal of the first switching transistor based on the first drive signal using a first drive circuit disposed on the integrated circuit.

Example 5

The method of one of examples 1 to 4, further including performing a power-up test including: before measuring the first time delay, deactivating the first switching transistor via a first drive circuit disposed on the integrated circuit, and using a current source, applying a first current at the monitoring terminal.

Example 6

The method of example 5, where the current source is disposed on the monolithic integrated circuit.

Example 7

The method of one of examples 1 to 6, further including providing a drive current to a motor via the first switching transistor.

Example 8

The method of one of examples 1 to 7, further including: generating a pulse-width modulated signal; and generating the first drive signal based on the pulse-width modulated signal.

Example 9

The method of one of examples 1 to 8, further including deactivating the first switching transistor in response to indicating the first error condition.

Example 10

An integrated circuit including: a monitoring circuit having an input coupled to a monitoring terminal configured to be coupled to an output terminal of a first switching transistor, where the monitoring circuit is configured to monitor an output signal at the monitoring terminal for a first output edge transition; a time measuring circuit coupled to the monitoring circuit, where the time measuring circuit is configured to measure a first time delay between a first input edge transition of a first drive signal and the first output edge transition, and where the first drive signal is configured to cause a change of state of the first switching transistor; and an analysis circuit coupled to the time measuring circuit and configured to compare the measured first time delay with a first predetermined threshold to form a first comparison result and to indicate a first error condition based on the first comparison result.

Example 11

The integrated circuit of example 10, further including a first drive circuit disposed on the integrated circuit, where the first drive circuit has an output coupled to a first drive terminal configured to be coupled to a control terminal of the first switching transistor, and the first drive circuit is configured to change the state of the first switching transistor based on the first drive signal.

Example 12

The integrated circuit of example 11, further including: a test current source coupled to the monitoring terminal; and control logic coupled to the test current source, the analysis circuit and the first drive circuit, where the control logic is configured to operate the integrated circuit in a test mode by deactivating the first switching transistor via the first drive circuit and applying a first current to the monitoring terminal via the test current source prior to measuring the first time delay.

Example 13

The integrated circuit of one of examples 11 or 12, further including control logic coupled to the analysis circuit and the first drive circuit, where the control logic is configured to deactivate the first switching transistor via the first drive circuit in response to the analysis circuit indicating the first error condition.

Example 14

The integrated circuit of one of examples 10 to 13, where the monitoring terminal is further configured to be coupled to an output terminal of a second switching transistor; the monitoring circuit is further configured to monitor the output signal at the monitoring terminal for a second output edge transition; the time measuring circuit is further configured to measure a second time delay between a second input edge transition of second drive signal and the second input edge transition, where the second drive signal is configured to cause a change of state of the second switching transistor; and the analysis circuit is further configured to compare the measured second time delay with a second predetermined threshold to form a second comparison result and to indicate a second error condition based on the second comparison result.

Example 15

The integrated circuit of one of examples 10 to 14, further including: a first drive circuit disposed on the integrated circuit, where the first drive circuit has an output coupled to a first drive terminal configured to be coupled to a control terminal of the first switching transistor, and where the first drive circuit is configured to change the state of the first switching transistor based on the first drive signal; and a second drive circuit disposed on the integrated circuit, where the second drive circuit has an output coupled to a second drive terminal configured to be coupled to a control terminal of the second switching transistor, and where the second drive circuit configured to change the state of the second switching transistor based on the second drive signal.

Example 16

The integrated circuit of one of examples 10 to 15, where the monitoring circuit includes an analog comparator; the time measuring circuit includes a counter; and the analysis circuit includes a digital comparator.

Example 17

The integrated circuit of one of examples 10 to 16, where the analysis circuit is further configured to: count a first number of times the first error condition is indicated; compare the first number of times with a predetermined error threshold; and indicate a first failure condition based on the comparing the first number of times with the predetermined error threshold.

Example 18

A motor system including: a first switching transistor; a second switching transistor; and at least one motor control circuit disposed on a monolithic integrated circuit. The at least one motor control circuit includes a first drive circuit having an output coupled to a control terminal of the first switching transistor, where the first drive circuit is configured to receive a first drive input signal having a first input edge transition and to generate a first drive signal based on the first drive input signal, and where the first drive signal is configured to cause a change of state of the first switching transistor; a second drive circuit having an output coupled to a control terminal of the second switching transistor, where the second drive circuit is configured to receive a second drive input signal having a second input edge transition and to generate a second drive signal based on the second drive input signal, and where the second drive signal is configured to cause a change of state of the second switching transistor; a comparator circuit having an input coupled to an output terminal of the first switching transistor and an output terminal of the second switching transistor, where the comparator circuit is configured to monitor an output signal at a monitoring terminal for a first output edge transition and a second output edge transition; a counter circuit coupled to the first drive circuit, the second drive circuit, and the comparator circuit, where the counter circuit is configured to measure a first time delay between the first input edge transition and the first output edge transition and to measure a second time delay between the second input edge transition and the second output edge transition; and an analysis circuit coupled to the counter circuit. The analysis circuit is configured to compare the measured first time delay with a first predetermined threshold to form a first comparison result, compare the measured second time delay with a second predetermined threshold to form a second comparison result, indicate a first error condition based on the first comparison result, and indicate a second error condition based on the second comparison result.

Example 19

The motor control circuit of example 18, where the at least one motor control circuit includes three motor control circuits.

Example 20

The motor system of one of examples 18 or 19, further including a three-phase motor, where each phase of the three-phase motor is coupled to a respective one of the three motor control circuits.

Example 21

The motor system of one of examples 18 to 20, where: the first switching transistor includes a first power IGBT or a first power MOSFET; and the second switching transistor includes a second power IGBT or a second power MOSFET.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
   using a monitoring circuit disposed on a monolithic integrated circuit, monitoring an output signal of a first switching transistor for a first output edge transition at a monitoring terminal of the monolithic integrated circuit;
   using a time measuring circuit disposed on the monolithic integrated circuit, measuring a first time delay between a first input edge transition of a first drive signal and the first output edge transition, wherein the first drive signal is configured to cause a change of state of the first switching transistor;
   using an analysis circuit disposed on the monolithic integrated circuit, comparing the measured first time delay with a first predetermined threshold to form a first comparison result;
   indicating a first error condition based on the first comparison result;
   using the monitoring circuit, monitoring an output signal of a second switching transistor for a second output edge transition at the monitoring terminal;
   using the time measuring circuit, measuring a second time delay between a second input edge transition of a second drive signal and the second output edge transition, wherein the second drive signal is configured to cause a change of state of the second switching transistor;
   using the analysis circuit, comparing the measured second time delay with a second predetermined threshold to form a second comparison result; and
   indicating a second error condition based on the second comparison result.

2. The method of claim 1, further comprising:
   using the time measuring circuit, measuring at least one of:
      a third time delay between a third input edge transition of the first drive signal and the second output edge transition, wherein the third input edge transition occurs when the first drive signal is de-asserted;
      a fourth time delay between a fourth input edge transition of the second drive signal and the first output edge transition, wherein the fourth input edge transition occurs when the second drive signal is de-asserted;
      a fifth time delay between the fourth input edge transition and the first input edge transition; or
      a sixth time delay between the third input edge transition and the second input edge transition.

3. The method of claim 1, further comprising driving a control terminal of the first switching transistor based on the first drive signal using a first drive circuit disposed on the monolithic integrated circuit.

4. The method of claim 1, further comprising providing a drive current to a motor via the first switching transistor.

5. The method of claim 1, further comprising:
   generating a pulse-width modulated signal; and
   generating the first drive signal based on the pulse-width modulated signal.

6. The method of claim 1, further comprising deactivating the first switching transistor in response to indicating the first error condition.

7. A method comprising:
   using a monitoring circuit disposed on a monolithic integrated circuit, monitoring an output signal of a first switching transistor for a first output edge transition at a monitoring terminal of the monolithic integrated circuit;
   using a time measuring circuit disposed on the monolithic integrated circuit, measuring a first time delay between a first input edge transition of a first drive signal and the first output edge transition, wherein the first drive signal is configured to cause a change of state of the first switching transistor;
   using an analysis circuit disposed on the monolithic integrated circuit, comparing the measured first time delay with a first predetermined threshold to form a first comparison result;
   indicating a first error condition based on the first comparison result; and
   performing a power-up test comprising:
      before measuring the first time delay:
         deactivating the first switching transistor via a first drive circuit disposed on the monolithic integrated circuit, and
         using a current source, applying a first current at the monitoring terminal.

8. The method of claim 7, further comprising:
   using the monitoring circuit, monitoring an output signal of a second switching transistor for a second output edge transition at the monitoring terminal;
   using the time measuring circuit, measuring a second time delay between a second input edge transition of a second drive signal and the second output edge transition, wherein the second drive signal is configured to cause a change of state of the second switching transistor;
   using the analysis circuit, comparing the measured second time delay with a second predetermined threshold to form a second comparison result; and
   indicating a second error condition based on the second comparison result.

9. The method of claim 7, wherein the current source is disposed on the monolithic integrated circuit.

10. An integrated circuit comprising:
    a monitoring circuit having an input coupled to a monitoring terminal configured to be coupled to an output terminal of a first switching transistor, wherein the monitoring circuit is configured to monitor an output signal at the monitoring terminal for a first output edge transition;
    a time measuring circuit coupled to the monitoring circuit, wherein the time measuring circuit is configured to measure a first time delay between a first input edge transition of a first drive signal and the first output edge transition, and wherein the first drive signal is configured to cause a change of state of the first switching transistor; and
    an analysis circuit coupled to the time measuring circuit and configured to compare the measured first time delay with a first predetermined threshold to form a first comparison result and to indicate a first error condition based on the first comparison result, wherein:

the monitoring terminal is further configured to be coupled to an output terminal of a second switching transistor, the monitoring circuit is further configured to monitor the output signal at the monitoring terminal for a second output edge transition, the time measuring circuit is further configured to measure a second time delay between a second input edge transition of a second drive signal and the second input edge transition, wherein the second drive signal is configured to cause a change of state of the second switching transistor, and the analysis circuit is further configured to compare the measured second time delay with a second predetermined threshold to form a second comparison result and to indicate a second error condition based on the second comparison result.

11. The integrated circuit of claim 10, further comprising a first drive circuit disposed on the integrated circuit, wherein the first drive circuit has an output coupled to a first drive terminal configured to be coupled to a control terminal of the first switching transistor, and the first drive circuit is configured to change the state of the first switching transistor based on the first drive signal.

12. The integrated circuit of claim 11, further comprising control logic coupled to the analysis circuit and the first drive circuit, wherein the control logic is configured to deactivate the first switching transistor via the first drive circuit in response to the analysis circuit indicating the first error condition.

13. The integrated circuit of claim 10, further comprising:
a first drive circuit disposed on the integrated circuit, wherein the first drive circuit has an output coupled to a first drive terminal configured to be coupled to a control terminal of the first switching transistor, and wherein the first drive circuit is configured to change the state of the first switching transistor based on the first drive signal; and
a second drive circuit disposed on the integrated circuit, wherein the second drive circuit has an output coupled to a second drive terminal configured to be coupled to a control terminal of a second switching transistor, and wherein the second drive circuit configured to change the state of the second switching transistor based on the second drive signal.

14. The integrated circuit of claim 10, wherein:
the monitoring circuit comprises an analog comparator;
the time measuring circuit comprises a counter; and
the analysis circuit comprises a digital comparator.

15. The integrated circuit of claim 10, wherein the analysis circuit is further configured to:
count a first number of times the first error condition is indicated;
compare the first number of times with a predetermined error threshold; and
indicate a first failure condition based on the comparing the first number of times with the predetermined error threshold.

16. An integrated circuit comprising:
a monitoring circuit having an input coupled to a monitoring terminal configured to be coupled to an output terminal of a first switching transistor, wherein the monitoring circuit is configured to monitor an output signal at the monitoring terminal for a first output edge transition;
a time measuring circuit coupled to the monitoring circuit, wherein the time measuring circuit is configured to measure a first time delay between a first input edge transition of a first drive signal and the first output edge transition, and wherein the first drive signal is configured to cause a change of state of the first switching transistor;

an analysis circuit coupled to the time measuring circuit and configured to compare the measured first time delay with a first predetermined threshold to form a first comparison result and to indicate a first error condition based on the first comparison result;

comprising a first drive circuit disposed on the integrated circuit, wherein the first drive circuit has an output coupled to a first drive terminal configured to be coupled to a control terminal of the first switching transistor, and the first drive circuit is configured to change the state of the first switching transistor based on the first drive signal;

a test current source coupled to the monitoring terminal; and control logic coupled to the test current source, the analysis circuit and the first drive circuit, wherein the control logic is configured to operate the integrated circuit in a test mode by deactivating the first switching transistor via the first drive circuit and applying a first current to the monitoring terminal via the test current source prior to measuring the first time delay.

17. The integrated circuit of claim 16, wherein:
the monitoring terminal is further configured to be coupled to an output terminal of a second switching transistor;
the monitoring circuit is further configured to monitor the output signal at the monitoring terminal for a second output edge transition;
the time measuring circuit is further configured to measure a second time delay between a second input edge transition of a second drive signal and the second input edge transition, wherein the second drive signal is configured to cause a change of state of the second switching transistor; and
the analysis circuit is further configured to compare the measured second time delay with a second predetermined threshold to form a second comparison result and to indicate a second error condition based on the second comparison result.

18. A motor system comprising:
a first switching transistor;
a second switching transistor;
at least one motor control circuit disposed on a monolithic integrated circuit, the at least one motor control circuit comprising:
a first drive circuit having an output coupled to a control terminal of the first switching transistor, wherein the first drive circuit is configured to receive a first drive input signal having a first input edge transition and to generate a first drive signal based on the first drive input signal, and wherein the first drive signal is configured to cause a change of state of the first switching transistor;
a second drive circuit having an output coupled to a control terminal of the second switching transistor, wherein the second drive circuit is configured to receive a second drive input signal having a second input edge transition and to generate a second drive signal based on the second drive input signal, and wherein the second drive signal is configured to cause a change of state of the second switching transistor;

a comparator circuit having an input coupled to an output terminal of the first switching transistor and an output terminal of the second switching transistor, wherein the comparator circuit is configured to monitor an output signal at a monitoring terminal for a first output edge transition and a second output edge transition;

a counter circuit coupled to the first drive circuit, the second drive circuit, and the comparator circuit, wherein the counter circuit is configured to measure a first time delay between the first input edge transition and the first output edge transition and to measure a second time delay between the second input edge transition and the second output edge transition; and an analysis circuit coupled to the counter circuit and configured to:
compare the measured first time delay with a first predetermined threshold to form a first comparison result,
compare the measured second time delay with a second predetermined threshold to form a second comparison result,
indicate a first error condition based on the first comparison result, and
indicate a second error condition based on the second comparison result.

19. The motor control circuit of claim 18, wherein the at least one motor control circuit comprises three motor control circuits.

20. The motor system of claim 19, further comprising a three-phase motor, wherein each phase of the three-phase motor is coupled to a respective one of the three motor control circuits.

21. The motor system of claim 18, wherein:
the first switching transistor comprises a first power IGBT or a first power MOSFET; and
the second switching transistor comprises a second power IGBT or a second power MOSFET.

* * * * *